(12) United States Patent
Dixit (10) Patent No.: US 6,744,838 B1
(45) Date of Patent: Jun. 1, 2004

(54) PLL LOCK DETECTOR (75) Inventor: Anand Dixit, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 783 days.

(21) Appl. No.: 09/645,869

(22) Filed: Aug. 24, 2000

(51) Int. Cl.[7] .............................................. H03D 3/24
(52) U.S. Cl. ........................................ 375/373; 327/156
(58) Field of Search ................................. 375/373, 374, 375/375, 376; 327/156, 157, 147

(56) References Cited

U.S. PATENT DOCUMENTS 5,327,103 A  *  7/1994  Baron et al. ................. 331/1 A
5,870,002 A  *  2/1999  Ghaderi et al. ................ 331/17
5,978,427 A  * 11/1999  Kuhara ......................... 375/376
6,133,769 A  * 10/2000  Fontana et al. .............. 327/156

* cited by examiner

Primary Examiner—Stephen Chin
Assistant Examiner—Kevin Kim
(74) Attorney, Agent, or Firm—Mark C. Pickering (57) ABSTRACT

A detector digitally monitors and detects when an oscillating signal output by a phase-locked-loop (PLL) is locked to a reference signal input to the PLL. The PLL includes a phase frequency detector that outputs an up signal and a down signal that each has a pulse width. When the oscillating signal is locked to the reference signal, the pulse widths of the up and down signals are equal. The detector detects when the pulse widths are unequal, and outputs a lock status signal that indicates this condition.

17 Claims, 5 Drawing Sheets

PLL LOCK DETECTOR

BACKGROUND OF THE INVENTION

1. Field of the Invention

The present invention relates to a phase-locked-loop (PLL) and, more particularly, to a detector for detecting when an oscillating signal output by the PLL is locked to a reference signal input to the PLL.

2. Description of the Related Art

A phase-locked-loop (PLL) is a circuit that generates a periodic signal that is equivalent to a reference signal (the signals have the same frequency (equal pulse widths) and are in phase). The periodic signal can be directly output from an oscillator, or can alternately be formed by frequency-dividing the signal output from the oscillator.

Figure 1:
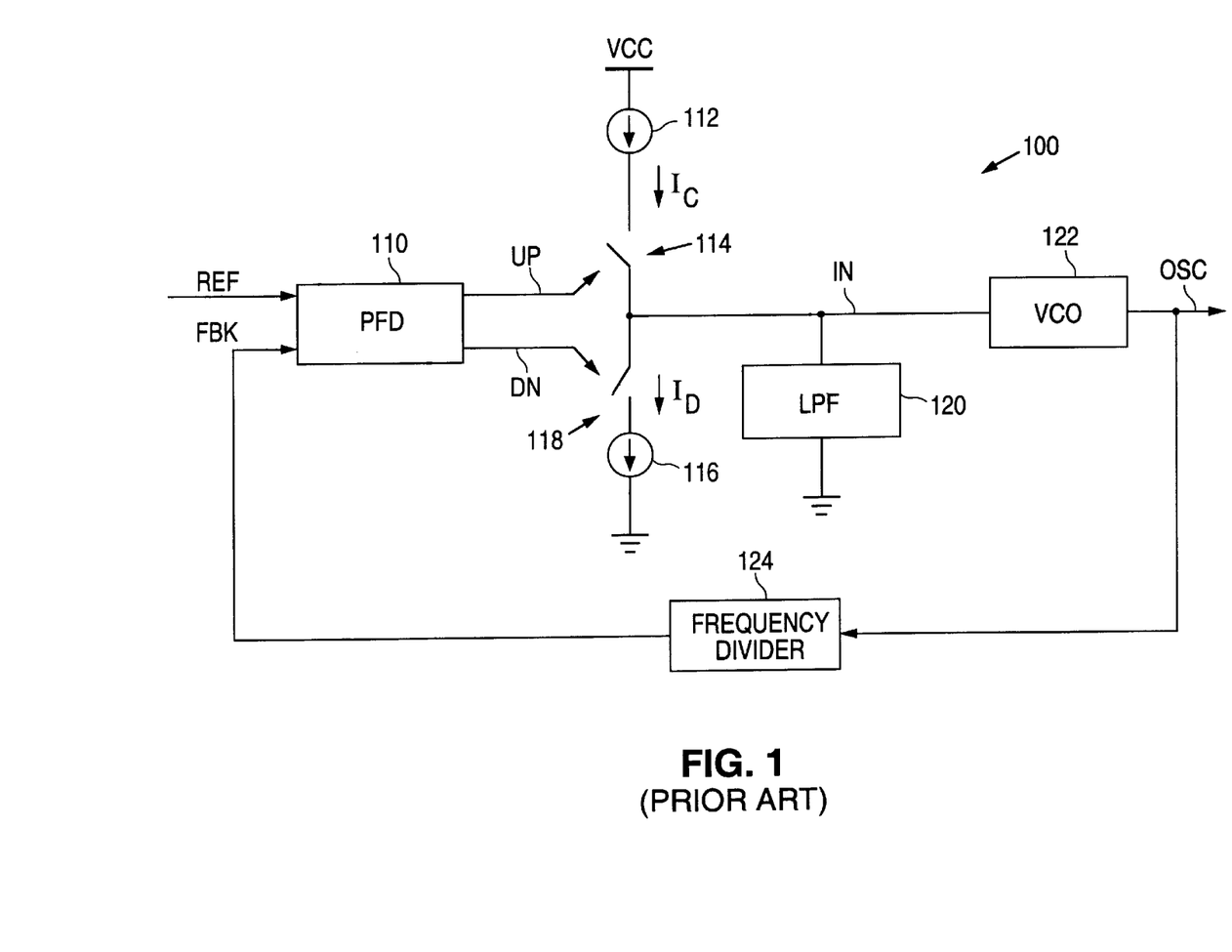
FIG. 1 is a block diagram illustrating a conventional PLL 100 that utilizes a frequency-divided output signal.

FIG. 1 shows a block diagram that illustrates a conventional PLL 100 that utilizes a frequency-divided output signal. As shown in FIG. 1, PLL 100 includes a phase frequency detector (PFD) 110 that detects the difference in phase and frequency between a periodic feedback signal FBK and a reference signal REF. In addition, PFD 110 outputs an up signal UP and a down signal DN that are responsive to the difference in phase and frequency.

As further shown in FIG. 1, PLL 100 also includes a first current source 112 that sources a charging current IC, and a first switch 114 that is connected between first current source 112 and an input node IN. First switch 114, which is controlled by the up signal UP, defines the amount of the charging current that is allowed to flow into the input node IN. First switch 114 is commonly implemented with a MOS transistor.

In addition, PLL 100 also includes a second current source 116 that sinks a discharging current ID that is equal to the charging current IC, and a second switch 118 connected between the input node IN and second current source 116. Second switch 118, which is controlled by the down signal DN, defines the amount of the charging current that is allowed to flow out of the input node IN. Second switch 118 is also commonly implemented with a MOS transistor.

PLL 100 further includes a low pass filter 120 that smoothes the voltage on the input node IN, and a voltage-controlled oscillator (VCO) 122 that outputs an oscillating signal OSC with a frequency and phase that are defined by the voltage on the input node IN. In addition, a frequency divider 124 divides down the oscillating signal OSC to output the feedback signal FBK with a frequency that is a fractional multiple of the frequency of the oscillating signal OSC. For example, if the oscillating signal OSC has a frequency of 200 MHz and frequency divider 124 divides the signal by two, the feedback signal FBK has a frequency of 100 MHz.

In operation, the phase of the feedback signal FBK, which represents the phase of the oscillating signal OSC, is compared to the phase of the reference signal REF by PFD 110. If the signals are in phase, the up and down signals UP and DN are defined to leave the voltage on the input node IN unchanged.

For example, when the feedback and reference signals FBK and REF are in phase, the up and down signals UP and DN can be equivalent. In this case, switches 114 and 118 are both closed at the same time for the same period of time. Since the charging and discharging currents IC and ID are equivalent, current source 116 sinks all of the current output by current source 112, thereby leaving the voltage on the input node IN unchanged.

If the feedback and reference signals FBK and REF are out of phase, the up and down signals UP and DN are defined to change the voltage on the input node IN to reduce the phase difference between the signals. For example, the up and down signals UP and DN can be output with unequal pulse widths when the feedback and reference signals FBK and REF are out of phase.

Assume that the phase of the oscillating signal OCS output by VCO 122, and thereby the phase of the feedback signal FBK, can be advanced by increasing the voltage on the input node IN. In this case, when the reference clock signal REF leads the feedback signal FBK, the up signal UP can be output with a pulse width that is larger than the pulse width of the down signal DN.

This, in turn, causes switch 114 to be closed for a greater period of time than switch 118. As a result, current source 112 sources more current into the input node IN via charging current IC than is removed by current source 114 via discharging current ID, thereby increasing the voltage on the input node IN.

Similarly, assume that the phase of the oscillating signal OCS output by VCO 122, and thereby the phase of the feedback signal FBK, can be retarded by reducing the voltage on the input node IN. In this case, when the reference clock signal REF lags the feedback signal FBK, the down signal DN can be output with a pulse width that is larger than the pulse width of the up signal UP.

This, in turn, causes switch 118 to be closed for a greater period of time than switch 114. As a result, current source 116 sinks more current from the input node IN via discharging current ID than is added by current source 112 via charging current IC, thereby decreasing the voltage on the input node IN.

It is often advantageous to know the state of the PLL, i.e., whether the oscillating signal output by the PLL is locked onto the reference signal. One prior art technique relies on analog processing of the up and down signals to determine the state of the PLL. Although this technique provides the necessary information, there is a need for other techniques for determining the state of a PLL.

SUMMARY OF THE INVENTION

The present invention provides a lock detector that digitally monitors and indicates the state of a phase-locked-loop (PLL), i.e., when an oscillating signal output by the PLL is locked to a reference signal input to the PLL. The PLL has a phase frequency detector (PFD) that outputs an up signal and a down signal that have pulse widths. The pulse widths of the up and down signals are equal when the oscillating signal is locked to the reference signal.

A lock detector in accordance with the present invention includes a dropped lock detection circuit that indicates when the up and down signals output by the PFD are not equivalent. In addition, the lock detector includes a first pulse latch that latches indications that the up and down signals are not equivalent during a first portion of each of a number of time periods.

Further, the lock detector includes a second pulse latch that latches indications that the up and down signals are not equivalent during a second portion of each of the number of time periods. The lock detector also includes an output stage that outputs a lock status signal that indicates whether indications that the up and down signals are not equivalent have been captured by the first pulse latch or the second pulse latch.

The present invention also includes a method for operating a lock detector that digitally monitors and indicates when an oscillating signal output by a PLL is locked to a reference signal input to the PLL. The method includes the step of indicating with a dropped lock detection circuit when the up and down signals output by the PFD are not equivalent.

The method also includes the step of latching with a first pulse latch indications that the up and down signals are not equivalent during a first portion of each of a number of time periods. The method further includes the step of latching with a second pulse latch indications that the up and down signals are not equivalent during a second portion of each of the number of time periods. The method additionally includes the step of outputting with an output stage a lock status signal that indicates whether indications that the up and down signals are not equivalent have been captured by the first pulse latch or the second pulse latch.

A better understanding of the features and advantages of the present invention will be obtained by reference to the following detailed description and accompanying drawings that set forth an illustrative embodiment in which the principles of the invention are utilized.

DETAILED DESCRIPTION

Figure 2:
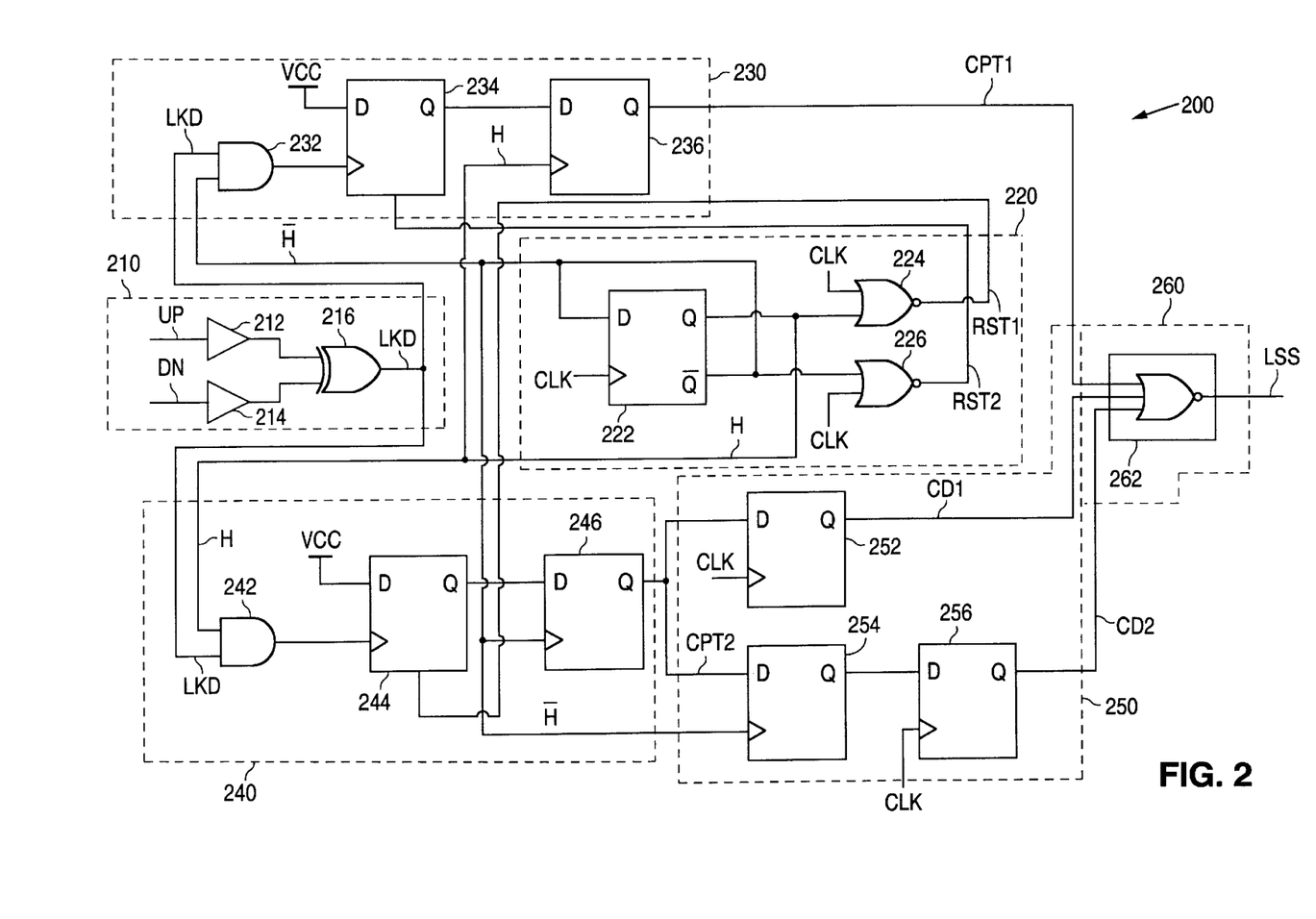
FIG. 2 is a block diagram illustrating a phase-locked-loop (PLL) lock detector 200 in accordance with the present invention.
Figure 3A:
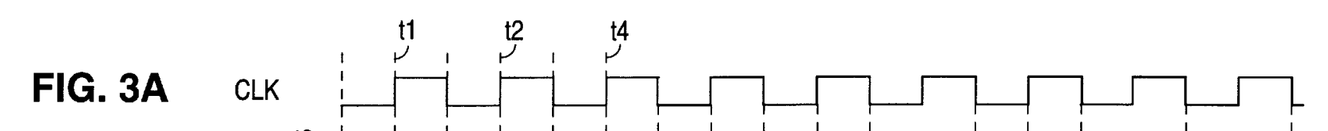
FIGS. 3A–3E are timing diagrams illustrating the operation of timing circuit 220 in accordance with the present invention.
Figure 3B:
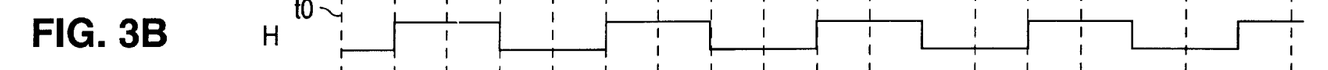
Figure 3C:
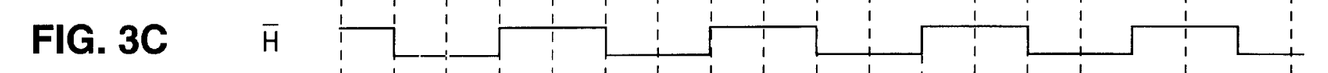
Figures 3D, 3E:
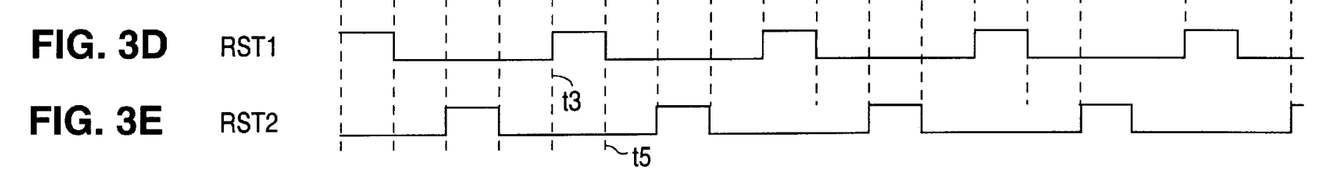

FIG. 2 shows a block diagram that illustrates a phase-locked-loop (PLL) lock detector 200 in accordance with the present invention. As described in greater detail below, lock detector 200 digitally monitors the state of the PLL, and outputs a lock status signal that indicates when the oscillating signal output by the PLL is locked to the reference signal input to the PLL.

As shown in FIG. 2, lock detector 200 includes a dropped lock detection circuit 210 that indicates when the up and down signals output by the phase frequency detector (PFD) of a PLL, such as PFD 110 of PLL 100, are not equivalent. As discussed above, when the oscillating signal is locked to the reference signal, the up and down signals are equivalent (the signals have equal pulse widths and are in phase). When the oscillating signal is no longer locked to the reference signal, the pulse widths of the up and down signals change and, therefore, are no longer equivalent.

Dropped lock detection circuit 210 can be implemented with, for example, an up buffer 212, a down buffer 214, and an exclusive OR (XOR) gate 216. Up buffer 212 can be connected to receive the up signal UP from PFD 110, while down buffer 214 can be connected to receive the down signal DN from PFD 110. XOR gate 216, in turn, has inputs connected to the outputs of buffers 212 and 214, and outputs a dropped lock signal LKD.

In operation, based on the truth table for an XOR gate, the logic state of the dropped lock signal LKD is a logic low when the up and down signals are equivalent (when the oscillating and reference signals have equal pulse widths and are in phase). In addition, the logic state changes to a logic high when the up and down signals are no longer equivalent.

Thus, when the up and down signals have unequal pulse widths, the dropped lock signal LKD output from XOR gate 216 pulses high for a time that is equal to the difference in the pulse widths. For example, assume that the rising edges of the up and down signals are in phase, the up signal has a pulse width of 100 uS, and the down signal has a pulse width of 120 uS. In this case, the dropped lock signal LKD has a logic low on the rising edge of the pulses, which changes to a logic high 100 uS later. The logic high, in turn, lasts for 20 uS before the logic state of the dropped lock signal LKD returns to a logic low.

As further shown in FIG. 2, lock detector 200 also includes a timing circuit 220 that outputs a number of timing signals. Timing circuit 220 can be implemented with, for example, a D-Q flip-flop 222, a first NOR gate 224, and a second NOR gate 226. Flop 222 has a D input, a clock input connected to receive a clock signal CLK, a Q output that outputs a half clock signal H, and a QBAR output connected to the D input that outputs an inverse half clock signal HBAR.

NOR gate 224 has a first input connected to receive the clock signal CLK, a second input connected to receive the half clock signal H, and an output that outputs a first reset signal RST1. NOR gate 226 has a first input connected to receive the clock signal CLK, a second input connected to receive the inverse half clock signal HBAR, and an output that outputs a second reset signal RST2.

FIGS. 3A–3E show timing diagrams that illustrate the operation of timing circuit 220 in accordance with the present invention. As shown in FIGS. 3A–3E, at time t0, the half clock signal H is low and the inverse clock signal HBAR is high. At time t1, on the rising edge of the clock signal CLK, the high from the inverse clock signal HBAR is latched which, in turn, causes the half clock signal H to rise and the inverse clock signal HBAR to fall.

At time t2, on the next rising edge of the clock signal CLK, the low from the inverse clock signal HBAR is latched which, in turn, causes the half clock signal H to fall and the inverse clock signal HBAR to rise. At time t3, on the next falling edge of the clock signal CLK, the clock signal CLK and the half clock signal H are both low. As a result, the first reset signal RST1 output from NOR gate 224 rises.

At time t4, on the next rising edge of the clock signal CLK, the high from the inverse clock signal HBAR is latched which, in turn, causes the half clock signal H to rise and the inverse clock signal HBAR to fall. At time t5, on the next falling edge of the clock signal CLK, both the clock signal CLK and the inverse half clock signal HBAR are both low. As a result, the second reset signal RST2 output from NOR gate 226 rises.

Thus, as shown in FIGS. 3A–3E, the half clock signal H and the inverse half clock signal HBAR have one-half the frequency of the clock signal CLK (twice the period). In addition, the first and second reset signals RST1 and RST2 are high for one-half clock period during the last quarter period of the half clock signal H and the inverse half clock signal HBAR, respectively.

As further shown in FIG. 2, lock detector 200 also includes a first pulse latch 230 that latches indications that the up and down signals are not equivalent from dropped lock detection circuit 210 during the first portion of each of a number of time periods. Lock detector 200 additionally includes a second pulse latch 240 that latches indications that the up and down signals are not equivalent from detection circuit 210 during the second portion of each of the number of time periods.

Latch 230 can be implemented with, for example, a first AND gate 232, a first D-Q flip-flop 234, and a second D-Q flip-flop 236. AND gate 232 has a first input connected to receive the dropped lock signal LKD, and a second input connected to receive the inverse half clock signal HBAR.

Flop 234 has a D input connected to a logic high voltage, a clock input connected to the output of AND gate 232, and a reset input connected to receive the second reset signal RST2. Flop 236 has a D input connected to the Q output of flop 234, a clock input connected to receive the half clock signal H, and an output that outputs a first captured signal CPT1.

Similarly, latch 240 can be implemented with, for example, a second AND gate 242, a third D-Q flip-flop 244, and a fourth D-Q flip-flop 246. AND gate 242 has a first input connected to receive the dropped lock signal LKD, and a second input connected to receive the half clock signal H.

Flop 244 has a D input connected to a logic high voltage, a clock input connected to the output of AND gate 242, and a reset input connected to receive the first reset signal RST1. Flop 246 has a D input connected to the Q output of flop 244, a clock input connected to receive the inverse half clock signal HBAR, and an output that outputs a second captured signal CPT2.

As additionally shown in FIG. 2, lock detector 200 optionally includes a delay stage 250 that delays the indications that the up and down signals are not equivalent from latches 230 and 240. Delay stage 250, which is utilized to control the sensitivity of lock detector 200, can be implemented with, for example, a fifth D-Q flip-flop 252, a sixth D-Q flip-flop 254, and a seventh D-Q flip-flop 256.

Flop 252 has a D input connected to receive the second capture signal CPT2, a clock input connected to receive the clock signal CLK, and a Q output that outputs a first delayed signal CD1. Flop 254 has a D input connected to receive the second capture signal CPT2, a clock input connected to receive the inverse half clock signal HBAR, and a Q output.

Flop 256 has a D input connected to receive the Q output of flop 254, a clock input connected to receive the clock signal CLK, and a Q output that outputs a second delayed signal CD2. Thus, in the example shown in FIG. 2, the first captured signal CPT1 is not delayed by delay stage 250, while the second captured signal CPT2 is delayed by flop 252 and by flops 254 and 256.

As further shown in FIG. 2, lock detector 200 includes an output stage 260 that outputs a lock status signal LSS that indicates whether indications that the up and down signals are not equivalent have been captured by pulse latch 230 or pulse latch 240. Output stage 260 can be implemented with, for example, a NOR gate 262.

NOR gate 262 has a first input connected to receive the first captured signal CPT1, a second input connected to receive the first delayed signal CD1, and a third input connected to receive the second delayed signal CD2. The truth table for a NOR gate defines a logic high only when all the inputs are low. Alternately, output stage 260 can be implemented with a more complex circuit that allows the lock status signal LSS to remain high when some number of inputs, such as two inputs, remain low. This allows more robustness and dead zone to be built into detector 200.

FIGS. 4A–4H show timing diagrams that illustrate the operation of lock detector 200 when the oscillating and reference signals fall out of lock when the inverse half clock signal HBAR is high in accordance with the present invention. As shown in FIGS. 4A–4H, from time t0 to time t1, the up and down signals are equivalent which, in turn, causes the logic state of the dropped lock signal LKD to be low.

This causes the logic states of the signals output from AND gates 232 and 242 to be low which, in turn, causes the logic states of the first and second captured signals CPT1 and CPT2 to be low. As a result, the delayed signals CD1 and CD2 are also low. Thus, the inputs to NOR gate 262 are all low which, in turn, causes gate 262 to output the lock status signal LSS as a logic high, thereby indicating that the oscillating signal output by the phase-locked-loop (PLL) is locked to the reference signal input to the PLL.

Figures 4A, 4B:
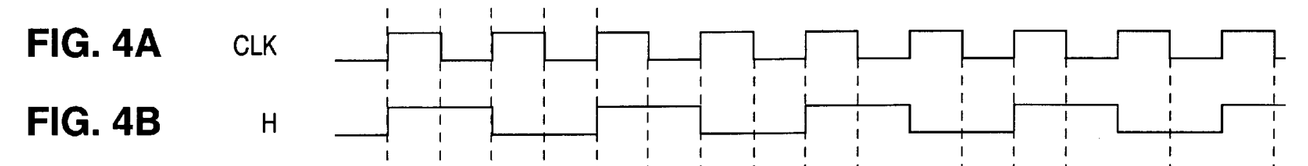
FIGS. 4A–4H are timing diagrams illustrating the operation of lock detector 200 when the oscillating and reference signals fall out of lock when the inverse half clock signal HBAR is high in accordance with the present invention.
Figures 4C, 4D, 4E, 4F, 4G:
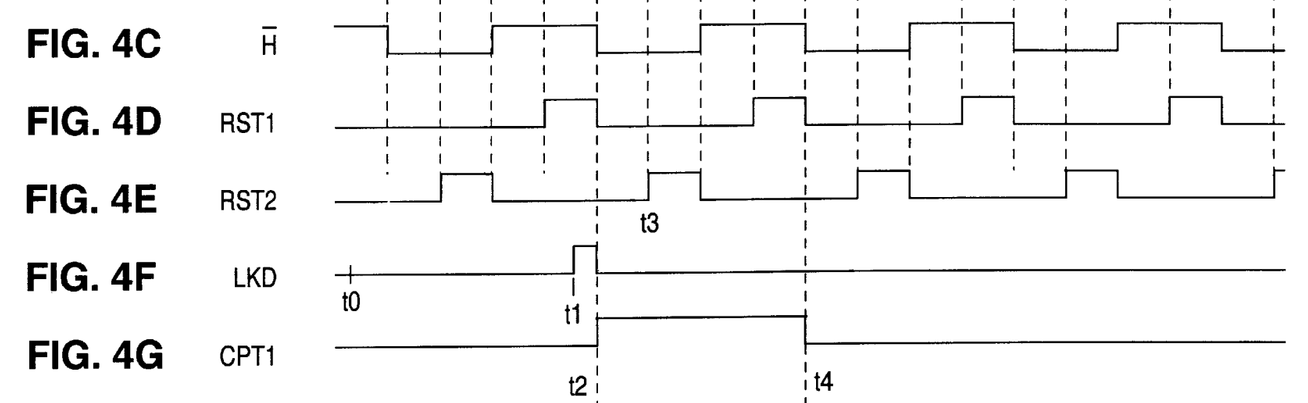
Figure 4H:
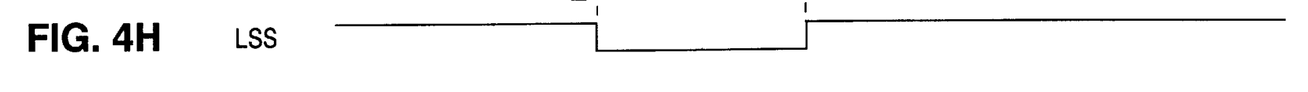

At time t1, however, the dropped lock signal LKD pulses high, thereby indicating that the up and down signals have different pulse widths and are no longer equivalent. Since the dropped lock signal LKD pulsed high at the same time that the inverse half clock signal HBAR was high, AND gate 232 outputs a logic high. (Although FIG. 4F shows the dropped lock signal LKD occurring at the end of the clock period, the signal LKD can occur at any point or multiple times during the clock period.) The logic high output by AND gate 232 causes flop 234 to latch a logic high.

At time t2, on the rising edge of the half clock signal H, the logic high latched by flop 234 is latched by flop 236 which, in turn, causes the logic state of the first captured signal CPT1 to rise. As a result, the logic state of the lock status signal LSS output by NOR gate 262 falls. At time t3, on the next falling edge of the clock signal CLK, the second reset signal RST2 rises which, in turn, causes the signal output from flop 234 to fall. At time t4, on the next rising edge of the half clock signal H, the logic state of the first captured signal CPT1 falls which, in turn, causes the logic state of the lock status signal LSS to rise. A logic high on the lock status signal indicates that the oscillating signal is again locked to the reference signal.

Thus, when the dropped lock signal LKD pulses high during a clock period where the inverse half clock signal HBAR is high, the lock status signal LSS falls for two clock periods following the clock period during which the dropped lock signal LKD pulsed high.

As noted above, delay stage 250 is optionally included. If delay stage 250 is omitted, the second captured signal CPT2 is fed directly into NOR gate 262. NOR gate 262, in turn, responds to the second captured signal CPT2 in the same way that it responds to the first captured signal CPT1. In this case, when the dropped lock signal LKD pulses high during a clock period where the half clock signal H is high, the lock status signal LSS falls for two clock periods following the clock period during which the dropped lock signal LKD pulses high.

As a result, when delay stage 250 is omitted, the lock status signal LSS stays low only if the dropped lock signal LKD is pulsed high again within the next two clock cycles following the clock cycle where the pulse occurred. Thus, if the dropped lock signal LKD pulses high more than two clock cycles after a prior pulse, the lock status signal LSS toggles.

FIGS. 5A–5J show timing diagrams that illustrate the operation of lock detector 200 when the oscillating and reference signals fall out of lock when the half clock signal H is high and delay stage 250 is present in accordance with the present invention. As shown in FIGS. 5A–5J, from time t0 to time t1, the up and down signals are equivalent. As discussed above, this condition causes the logic state of the lock status signal LSS to be high.

Figure 5A:
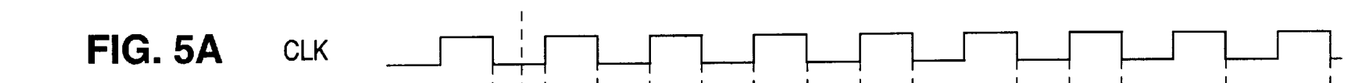
FIGS. 5A–5J are timing diagrams illustrating the operation of lock detector 200 when the oscillating and reference signals fall out of lock when the half clock signal H is high and delay stage 250 is present in accordance with the present invention.
Figure 5B:
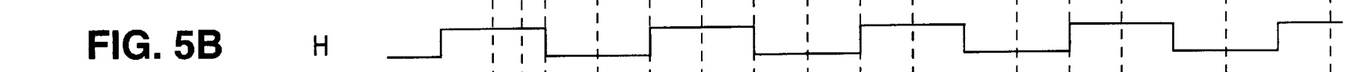
Figure 5C:
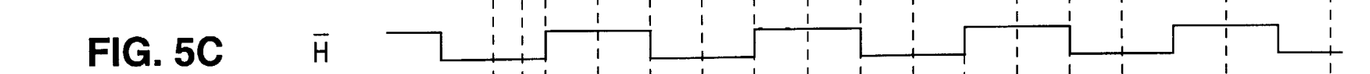
Figure 5D:
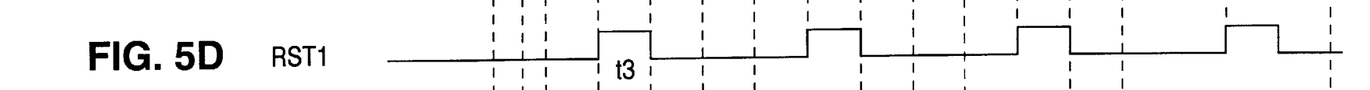
Figure 5E:
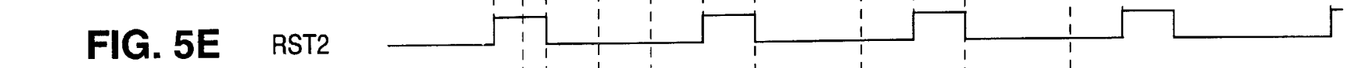
Figure 5F:
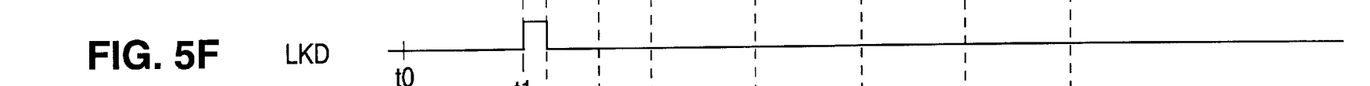
Figure 5G:
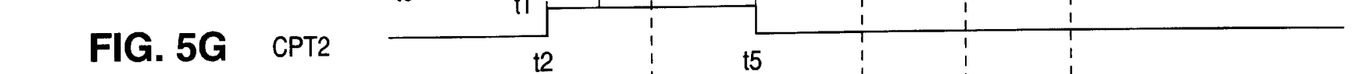
Figure 5H:
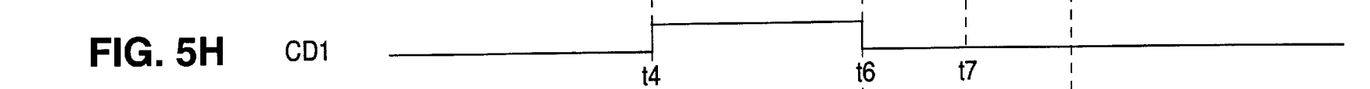
Figure 5I:
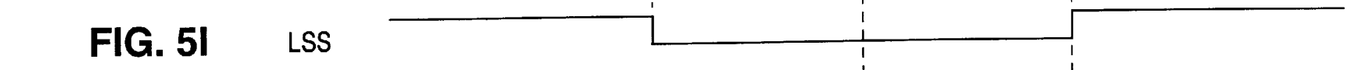
Figure 5J:
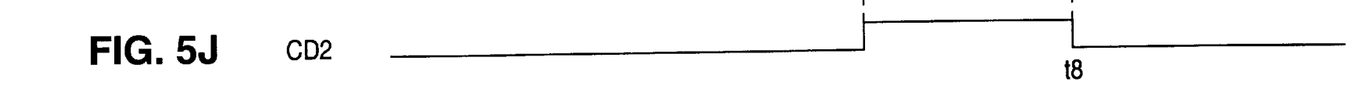

At time t0, however, the dropped lock signal LKD pulses high, thereby indicating that the up and down signals have different pulse widths and are no longer equivalent. Since the dropped lock signal LKD pulsed high at the same time that the half clock signal H was high, AND gate 242 outputs a logic high. (Although FIG. 5F shows the dropped lock signal LKD occurring at the end of the clock period, the signal LKD can occur at any point or multiple times during the clock period.) The logic high output by AND gate 242 causes flop 244 to latch a logic high.

At time t2, on the rising edge of the inverse half clock signal HBAR, the logic high latched by flop 244 is latched by flop 246 which, in turn, causes the logic state of the second captured signal CPT2 to rise. At time t3, on the next falling edge of the clock signal CLK, the first reset signal RST1 rises which, in turn, causes the signal from flop 244 to fall.

At time t4, on the next rising edge of the clock signal CLK, the first delayed signal CD1 is output from flop 252, thereby causing the lock status signal LSS to fall. At time t5, on the next rising edge of the inverse half clock signal HBAR, flop 246 latches the logic low which, in turn, causes the logic state of the second captured signal CPT2 to fall. At the same time, flop 254 latches the logic high of the second captured signal CPT2 before the output of flop 246 falls.

At time t6, on the rising edge of the next clock signal CLK, flop 252 latches the logic low of signal CPT2 which, in turn, causes the logic state of the first delayed signal CD1 to fall. At the same time, flop 256 latches the logic high output by flop 254, thereby causing the logic state of the second delayed signal CD2 to rise.

At time t7, on the rising edge of the next inverted half clock signal HBAR, flop 254 latches the logic low of the second captured signal CPT2. At time t8, on the rising edge of the next clock signal CLK, flop 256 latches the logic low from flop 254, thereby causing the second delayed signal CD2 to fall. As a result, the lock status signal LSS rises.

A logic high on the lock status signal indicates that the oscillating signal is again locked to the reference signal. Thus, if the oscillating and reference signals fall out of lock when the half clock signal H is high, the lock status signal LSS falls for four clock periods one clock period following the clock period during which the signals fell out of lock.

As noted above, when delay stage 250 is omitted, the lock status signal LSS toggles if the dropped lock signal LKD pulses high, and then again pulses high more than two clock cycles later. However, when delay stage 250 is included, the lock status signal LSS will remain low if the dropped lock signal LKD is again pulsed high within four clock cycles of the previous pulse.

For example, if the dropped lock signal LKD pulses high within the clock period that begins at time t6 and ends at time t7, the lock status signal LSS remains low, thereby indicating that the oscillating signal and the reference signal remain out of lock. Thus, delay stage 250 allows the sensitivity of lock detector 200 to be varied. Further, additional logic blocks can be used to provide different levels of sensitivity.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A detector for indicating when an oscillating signal output by a phase-locked-loop (PLL) is locked to a reference signal input to the PLL, the PLL having a phase frequency detector (PFD) that outputs an up signal and a down signal, the up and down signals having pulse widths, the pulse widths being equal when the oscillating signal is locked to the reference signal, the detector comprising:
    a dropped lock detection circuit that indicates when the up and down signals output by the PFD are not equivalent;
    a first pulse latch that latches indications during a first portion of each of a number of time periods that the up and down signals are not equivalent;
    a second pulse latch that latches indications during a second portion of each of the number of time periods that the up and down signals are not equivalent; and
    an output stage that outputs a lock status signal that indicates whether indications that the up and down signals are not equivalent have been captured by the first pulse latch or the second pulse latch.

2. The detector of claim 1 wherein the dropped lock detection circuit includes an exclusive OR gate that outputs a dropped lock signal that indicates when the pulse widths of the up and down signals are not equal.

3. The detector of claim 2 wherein the dropped lock detection circuit further includes:
    a first buffer that is connectable to receive the up signal and connected to the exclusive OR gate; and
    a second buffer that is connectable to receive the down signal and connected to the exclusive OR gate.

4. The detector of claim 2 wherein the first pulse latch includes:
    a first AND gate having a first input connected to receive the dropped lock signal, and a second input connected to receive an inverse half clock signal;
    a first D-Q flip-flop having a D input connected to a logic high voltage, a clock input connected to the output of the first AND gate, and a reset input connected to receive a reset signal; and
    a second D-Q flip-flop having a D input connected to the Q output of the first flip-flop, a clock input connected to receive a half clock signal, and an output that outputs a first captured signal.

5. The detector of claim 4 wherein the second pulse latch includes:
    a second AND gate having a first input connected to receive the dropped lock signal, and a second input connected to receive the half clock signal;
    a third D-Q flip-flop having a D input connected to a logic high voltage, a clock input connected to the output of the second AND gate, and a reset input connected to receive a reset signal; and
    a fourth D-Q flip-flop having a D input connected to the Q output of the third flip-flop, a clock input connected to receive the inverse half clock signal, and an output that outputs a second captured signal.

6. The detector of claim 5 wherein the output stage includes a logic block having a first input connected to receive the first captured signal, and a second input connected to receive the second captured signal.

7. The detector of claim 6 wherein the logic block includes a NOR gate.

8. The detector of claim 5 and further including a delay stage, the delay stage including:
    a fifth D-Q flip-flop having a D input connected to receive the second capture signal, a clock input connected to receive the clock signal, and a Q output that outputs a first delayed captured signal;

a sixth D-Q flip-flop having a D input connected to receive the second capture signal, a clock input connected to receive the inverse half clock signal, and a Q output; and a seventh D-Q flip-flop having a D input connected to receive the Q output of the sixth flip-flop, a clock input connected to receive the clock signal, and a Q output that outputs a second delayed captured signal.

9. The detector of claim 8 wherein the output stage includes a logic block having a first input connected to receive the first captured signal, a second input connected to receive the first delayed signal, and a third input connected to receive the second delayed signal.

10. The detector of claim 9 wherein the logic block includes a NOR gate.

11. A method for operating a detector that indicates when an oscillating signal output by a phase-locked-loop (PLL) is locked to a reference signal input to the PLL, the PLL having a phase frequency detector (PFD) that outputs an up signal and a down signal, the up and down signals having pulse widths, the pulse widths being equal when the oscillating signal is locked to the reference signal, the method comprising the steps of:

indicating with a dropped lock detection circuit when the up and down signals output by the PFD are not equivalent;

latching with a first pulse latch indications during a first portion of each of a number of time periods that the up and down signals are not equivalent;

latching with a second pulse latch indications during a second portion of each of the number of time periods that the up and down signals are not equivalent; and outputting with an output stage a lock status signal that indicates whether indications that the up and down signals are not equivalent have been captured by the first pulse latch or the second pulse latch.

12. The method of claim 11 wherein the dropped lock detection circuit includes an exclusive OR gate that outputs a dropped lock signal that indicates when the pulse widths of the up and down signals are not equal.

13. The method of claim 12 wherein the dropped lock detection circuit further includes:

a first buffer that is connectable to receive the up signal and connected to the exclusive OR gate; and a second buffer that is connectable to receive the down signal and connected to the exclusive OR gate.

14. The method of claim 12 wherein the first pulse latch includes:

a first AND gate having a first input connected to receive the dropped lock signal, and a second input connected to receive an inverse half clock signal;

a first D-Q flip-flop having a D input connected to a logic high voltage, a clock input connected to the output of the first AND gate, and a reset input connected to receive a reset signal; and a second D-Q flip-flop having a D input connected to the Q output of the first flip-flop, a clock input connected to receive a half clock signal, and an output that outputs a first captured signal.

15. The method of claim 14 wherein the second pulse latch includes:

a second AND gate having a first input connected to receive the dropped lock signal, and a second input connected to receive the half clock signal;

a third D-Q flip-flop having a D input connected to a logic high voltage, a clock input connected to the output of the second AND gate, and a reset input connected to receive a reset signal; and a fourth D-Q flip-flop having a D input connected to the Q output of the third flip-flop, a clock input connected to receive the inverse half clock signal, and an output that outputs a second captured signal.

16. The method of claim 15 wherein the output stage includes:

a fifth D-Q flip-flop having a D input connected to receive the second capture signal, a clock input connected to receive the clock signal, and a Q output that outputs a first delayed captured signal;

a sixth D-Q flip-flop having a D input connected to receive the second capture signal, a clock input connected to receive the inverse half clock signal, and a Q output;

a seventh D-Q flip-flop having a D input connected to receive the Q output of the sixth flip-flop, a clock input connected to receive the clock signal, and a Q output that outputs a second delayed captured signal; and a logic block having a first input connected to receive the first captured signal, a second input connected to receive the first delayed captured signal, and a third input connected to receive the second delayed captured signal.

17. The method of claim 16 wherein the logic block includes a NOR gate.

* * * * *

UNITED STATES PATENT AND TRADEMARK OFFICE
CERTIFICATE OF CORRECTION

PATENT NO.     : 6,744,838 B1
DATED          : June 1, 2004
INVENTOR(S)    : Dixit It is certified that error appears in the above-identified patent and that said Letters Patent is hereby corrected as shown below:

<u>Column 7,</u>
Line 4, delete "t0" and replace with -- t1 --.

Signed and Sealed this

Twenty-seventh Day of July, 2004

JON W. DUDAS
*Acting Director of the United States Patent and Trademark Office*